US 8,282,406 B2

(12) United States Patent
Pipho et al.

(10) Patent No.: US 8,282,406 B2
(45) Date of Patent: Oct. 9, 2012

(54) CONNECTOR WITH ELECTROSTATIC DISCHARGE PROTECTION

(75) Inventors: David A Pipho, Tomball, TX (US);
David W Kuehl, Houston, TX (US);
Patrick R Conway, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 296 days.

(21) Appl. No.: 12/729,729

(22) Filed: Mar. 23, 2010

(65) Prior Publication Data

US 2011/0237095 A1    Sep. 29, 2011

(51) Int. Cl.
*H01R 13/53*    (2006.01)

(52) U.S. Cl. .............. 439/181; 439/607.34; 439/924.1

(58) Field of Classification Search .............. 439/181, 439/326, 64, 607.34, 924.1; 361/737, 818, 361/753
See application file for complete search history.

(56) References Cited

U.S. PATENT DOCUMENTS

| 5,747,735 | A | * | 5/1998 | Chang et al. ............... 174/51 |
| 5,906,496 | A | * | 5/1999 | DelPrete et al. ............ 439/95 |
| 6,151,202 | A | * | 11/2000 | Mueller et al. ............. 361/212 |
| 6,603,657 | B2 | | 8/2003 | Tanzer et al. |
| 6,955,551 | B2 | * | 10/2005 | Yamamoto ................. 439/181 |
| 7,172,430 | B2 | | 2/2007 | Kojima |
| 7,255,577 | B2 | | 8/2007 | Graham et al. |
| 7,581,967 | B2 | | 9/2009 | Collantes, Jr. et al. |
| 2007/0261235 | A1 | * | 11/2007 | Byrd et al. ................. 29/832 |

FOREIGN PATENT DOCUMENTS

WO    WO2009/134240    5/2009

* cited by examiner

*Primary Examiner* — Xuong Chung Trans
(74) *Attorney, Agent, or Firm* — Arthur Ortega

(57) ABSTRACT

An electrical connector having electrostatic discharge protection comprises a body and an electrostatic discharge dissipative element. The body defines a socket having electrical contacts configured to make electrical contact with electrical contacts along a bottom surface of a component module when the component module is inserted in the socket. The electrostatic discharge dissipative element is configured to make contact with the electrical contacts along the bottom surface of the component module before the electrical contacts along the bottom surface of the component module make contact with the electrical contacts of the socket.

20 Claims, 2 Drawing Sheets

CONNECTOR WITH ELECTROSTATIC DISCHARGE PROTECTION

BACKGROUND

Electronic components are often coupled together via connectors. Electrostatic discharge (ESD) can cause damage to electronic components. It is desirable to reduce the occurrence of ESD in electronic components and devices.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described above, electrostatic discharge (ESD) can cause damage to electronic components. In some embodiments of the invention, disclosed is a connector having an ESD dissipative element that may help reduce the occurrence of ESD when component modules are connected to electronic devices. For example, the ESD element may be coupled to the connector in a manner such that the component module can make contact with the element before the module can make contact with the connector. Accordingly, ESD charge is dissipated through the element and to a ground point rather than through the connector and to an electronic component on the electronic device, thereby helping to prevent potential damage to an electronic component.

Figure 1:
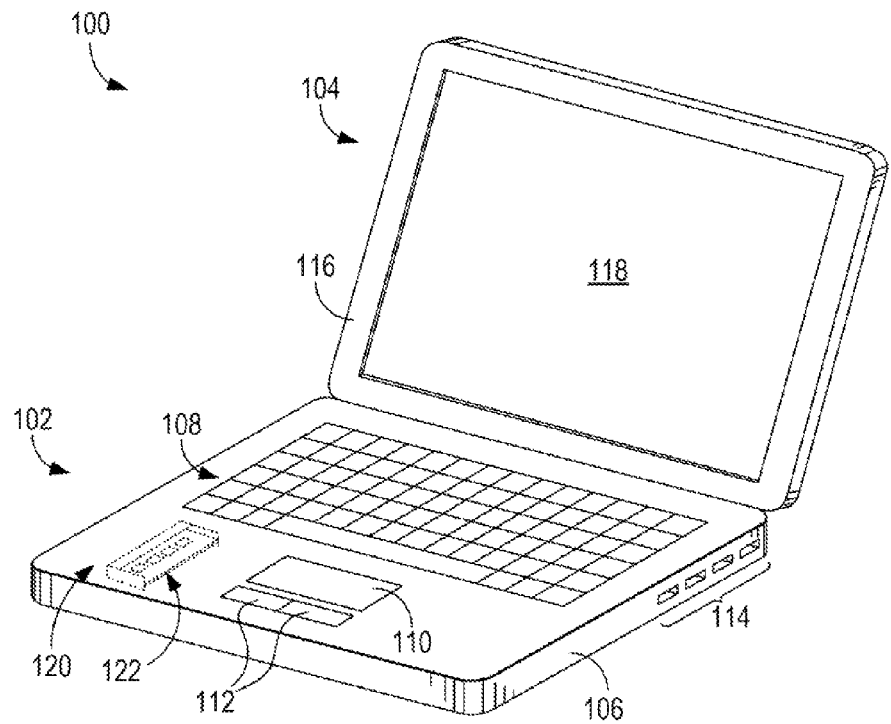
FIG. 1 is a perspective view of an embodiment of an electronic device comprising an electrical connector having electrostatic discharge protection, constructed in accordance with at least some illustrative embodiments.

Referring now in more detail to the drawings in which like numerals indicate corresponding parts throughout the views, FIG. 1 illustrates an electronic device 100 in the form of a notebook or "laptop" computer. Although a notebook computer has been explicitly illustrated and identified, it is noted that the notebook computer is cited only as an example. Therefore, the teachings of the present disclosure equally apply to other electronic devices such as server computers, desktop computers, and game consoles.

As indicated in FIG. 1, the electronic device 100 includes a base portion 102 and a display portion 104 that are attached to each other with a hinge mechanism (not shown). The base portion 102 includes an outer housing 106 that surrounds various internal components of the computing device 100, such as a processor, memory, hard drive, and the like. Also included in the base portion 102 are user input devices, including a keyboard 108, a mouse pad 110, and selection buttons 112, as well as various ports or connectors 114 that are accessible through the housing 106. The display portion 102 includes its own outer housing 116 that supports a display device 118, such as a liquid crystal display (LCD).

As is further depicted in FIG. 1, the base portion 102 also comprises an internal electrical connector 120 to which a component module 122 is connected. As explained below in further detail, the electrical connector 120 comprises an ESD dissipative element which provides electrostatic discharge protection when the component module 122 is connected to connector 120. Example embodiments of the connector 120 and the module 122 are described in the figures that follow.

Figure 2:
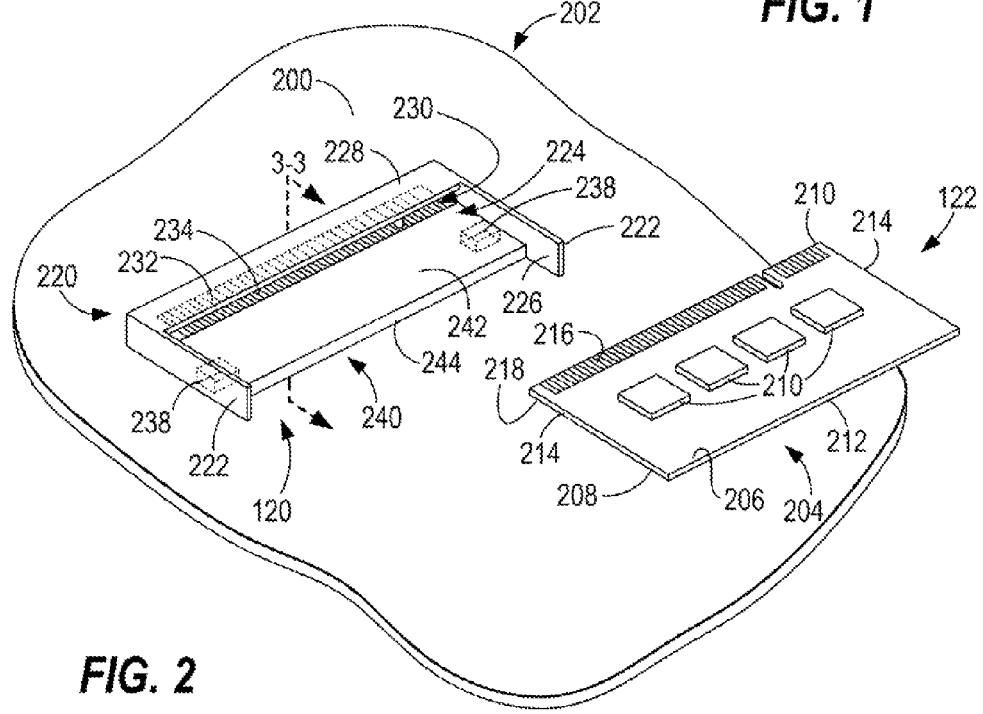
FIG. 2 is a partial perspective view of the connector identified in FIG. 1, constructed in accordance with at least some illustrative embodiments.

Referring now to FIG. 2, the electrical connector 120 and the component module 122 are shown in greater detail. As indicated in FIG. 2, the connector 120 is mounted to a surface 200 of a circuit board 202. By way of example, the circuit board 202 comprises a motherboard of the electronic device 100. As is further indicated in FIG. 2, the module 122 comprises its own circuit board 204 that includes a top surface 206 and a bottom surface 208 to which various components 210 are mounted. By way of example, the components 210 may comprise random access memory (RAM) chips. In such a case, the module 122 may be referred to as a memory module. However, it should be understood that the module may support other types of electronic components. The circuit board 204 of the module 122 includes a front edge 210, rear edge 212, and opposed lateral edges 214. Provided along the top surface 206 are multiple electrical contacts 216 and provided along the bottom surface 208 are multiple electrical contacts 218.

With further reference to FIG. 2, the electrical connector 120 comprises a body 220 and lateral arms 222 that extend out from the body. In some embodiments, the body, 220 and arms 222 are unitarily formed from the same piece of material. By way of example, the connector body 220 and arms 222 are formed using an injection molding process. The body 220 comprises a socket 224 that is adapted to receive the front edge 210 of the module circuit board 204. The socket 224 may be defined by inner surfaces 226 of the arms 222, a cover 228 of the body 220, and an opening 230. The socket 224 includes upper integrated electrical contacts 232 and lower integrated electrical contacts 234 that are adapted to mate, respectively, with top contacts 216 and bottom contacts 218 of the component module 122 when the module circuit board 204 is inserted into the socket 224.

The connector body 220 includes ground conductors 238 which are to be connected to a ground reference point on the circuit board 202. In one embodiment, the ground conductors 238 are in the form of protrusions extending from the inner surfaces 226 of the lateral arms 222. The ground conductors 238 are connected to at least a portion of ESD element 240. As explained below, in this manner, the ESD element 240 provides an ESD discharge path for charge to flow from the component module 122, through the ESD element and to the ground conductors 238, and not through the contacts of the socket 224 thereby helping to prevent damage due to ESD. Although two ground conductors are shown, it should be understood that a single conductor or more than two conductors would be equally applicable.

As is further illustrated in FIG. 2, the ESD element 240 is coupled to the socket 224 in a manner to have the bottom contacts 218 on the bottom surface 208 of the component module 122 make contact with the element 240 before the contacts 218 of the module make contact with the lower contacts 234 of the socket 224 when the module is being inserted into the socket. The element 240 is to be connected to a ground reference point to properly provide a ground path for ESD protection. In the embodiment of FIG. 2, the opposing ends of the element 240 are electrically connected to ground conductors 238 of the connector. However, it should be understood that the element 240 may be connected to other ground points on the connector 120 or circuit board 202. For example, the element 240 can be connected to ground trace on the circuit board 200 using an electrical conductor such as a wire. The element 240 can be secured to the connector 120 or circuit board 200 using various attachment means. For example, a bottom surface 244 of the element 240 can secured to the surface 202 of the circuit board 200 using an adhesive means such as contact cement, glue tape or other adhesive means.

In the embodiment of FIG. 2, the element 240 is defined by a body having a generally rectangular cross section along its longitudinal axis. The element has a top surface 242 that extends along its longitudinal axis. However, it should be understood that the element 240 may have other shapes and forms. For example, the element 240 can have a generally oval cross section along its longitudinal axis. The element 240 is shown as a single contiguous body but it may comprise a plurality of elements coupled together to form a single body. In another embodiment, the element 240 may comprise a plurality of spaced apart elements. The element 240 can be made of a resilient material. For example, the element 240 can be made of a foam material or other similar material. The element 240 can be made of a combination of resilient and non-resilient material so long as it can compress and expand to allow insertion and removal of the module circuit board, as explained below. The element 240 can be made of ESD dissipative material or a combination of ESD dissipative material and non-ESD dissipative material. The top surface 242 of the element 240 may provide a relatively large surface area which may help improve physical contact with the module 122 and thereby help increase dissipation of electrostatic charge.

Figure 3A:
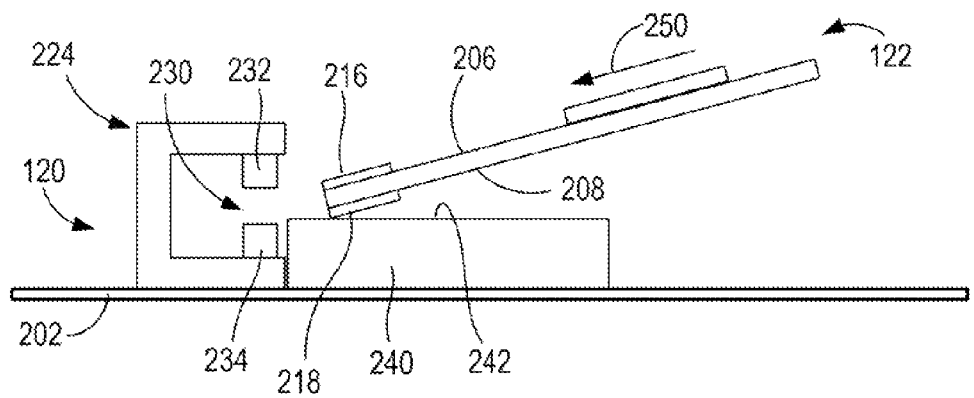
FIGS. 3A-3C are schematic cross-sectional side views of the connector of FIG. 2, illustrating connection of a component module to the connector, constructed in accordance with at least some illustrative embodiments.

The ESD element 240 can be disposed adjacent the opening 230 of the socket 224 such that the top surface 242 of the element is at height that is at least the same height or higher than the top surface of the bottom contacts 234 of the socket (best shown in FIG. 3A). In this manner, the bottom contacts 218 of the module 122 can make contact with the top surface 242 of the element 240 before the contacts 218 make contact with the bottom contacts 234 of the socket 224.

As described above, the component module 122 can be connected to the electrical connector 120 by inserting an edge of the module circuit board 204 into the socket 224. Illustrated in FIGS. 3A-3C are various examples of such insertion.

Beginning with FIG. 3A, illustrated is initial insertion of the component module 122 into the socket 224 of the connector 120. As indicated in FIG. 3A, the front edge 210 of the circuit board 204 is introduced to the socket 224 (in the generally in the direction shown by arrow 250) with the circuit board 204 held at an angle relative to the connector 120 and the motherboard 202 to which the connector 120 is mounted. Accordingly, the bottom contacts 218 on the bottom surface 208 of the module circuit board 204 make contact with the top surface 242 of the ESD element 240. As a result, any ESD charge that is present on the component module 122 is dissipated through the element 240 and to ground rather than through the socket 224. As explained below, as the circuit board 204 of the module is further inserted into the socket 224, there is no longer any ESD charge present on the module that would flow into the socket 224.

Figure 3B:
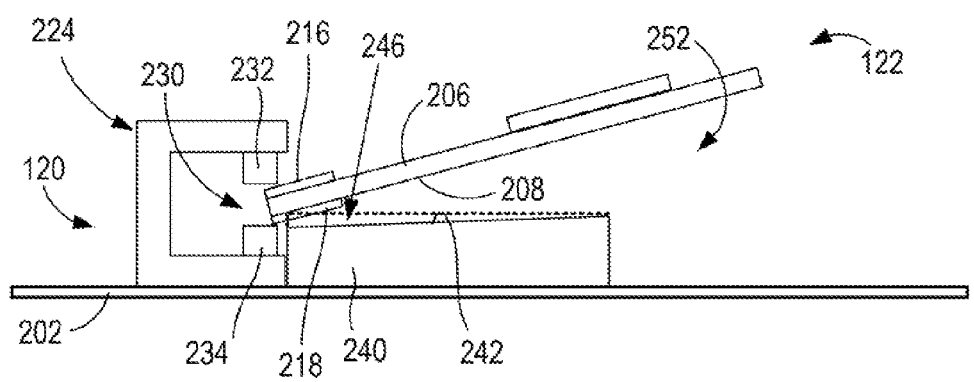

At FIG. 3B, the front edge 210 of the module circuit board 204 is further moved toward the socket 224. As the front edge 210 of the module circuit board 204 is further moved towards the opening 230 of the socket 224 (in the general direction shown by arrow 252), the downward pressure causes a portion by the top surface 242 of the ESD element 240 to lightly deform or compress (shown by dashed lines) in the downward direction (shown by arrow 246). This allows the front edge 210 of the module circuit board 204 to enter the opening 230 of the socket 224 and make contact with the top contacts 232 and bottom 234 of the socket 224.

Figure 3C:
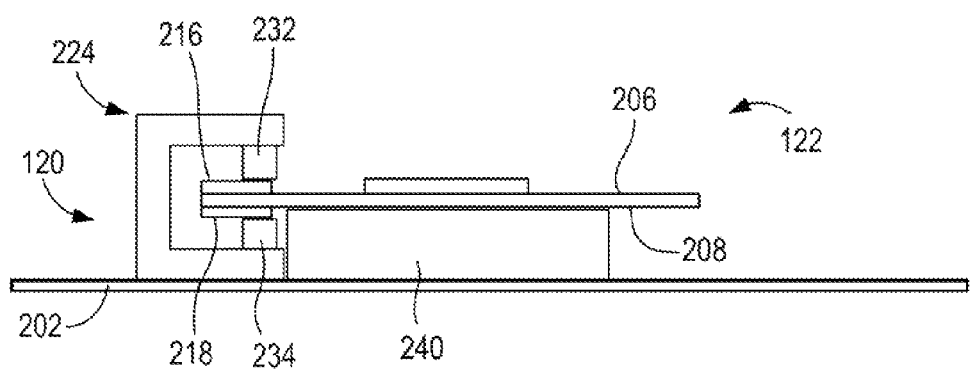

At FIG. 3C, the module circuit board 204 is fully inserted into the socket 224. The module circuit board 204 is shown electrically engaged with the socket 224 with the element 240 expanding to its original shape to provide a snug fit. The connector 120 with ESD protect may help reduce ESD charge from being introduced into the socket 224 and help reduce damage to any electronics on the mother board. The ESD element 240 can be coupled to the connector 120 in a manner such that ESD charge present on the module is dissipated through the element 240 and not the socket 224. That is, any ESD charge that is present on the module 122 bypasses the socket 224 and is safely routed or diverted to ground.

The above provided a description of insertion of the module 120 into the opening 230 of the socket 224. Although not shown, the ESD element 240 can allow the removal of the module 120 from the socket 224. To remove the module 120, the circuit board 204 can be grasped towards the rear edge 212 of the board and then urged in a direction away from the socket 224. When sufficient pressure is applied to remove the module 120 from the socket 224, the ESD element 240 returns to its original shape. As explained above, the element 240 was slightly deformed or compressed in the downward direction to allow insertion of the module 122 into the socket 224. Now, after removal, the element 240 expands in the upward direction to a height above the surface of the bottom contacts 234 of the socket 224. The socket 224 is now ready to accept a component module 122 and provide ESD protection to such a module.

Advantages may be provided by embodiments of the invention. For example, the techniques disclosed herein may help reduce ESD damage to memory components in an electronic device such as a notebook computer. Some notebook computers have an internal memory socket underneath a door of the base of the notebook. The memory socket is typically connected to a memory controller. The notebook customer is instructed that ESD protection must be used when changing/adding memory components (also called memory cards) in order to prevent ESD damage to the components. Despite such instructions, it is common for users to access the memory component without ESD protection and this can lead to damage of internal components of the computer, typically the memory controller. This can result in a latent failure which may require a system board replacement.

In one embodiment of the invention, ESD protection can be added to the memory slot connector which can help reduce memory-ESD related service events. The ESD protection can be in the form of ESD-dissipative element 240 (using material such as ESD foam) placed across a front opening of the memory socket and connected to ground contacts (which provides a discharge path) so that when a user is inserting memory components, any ESD charge will be directed through the element 240 to ground rather than through the memory connector and therefore prevent potential damage to the memory controller.

In other embodiments, the ESD element 240 may provide cost effective ESD protection. For example, the ESD element 240 can be applied to a standard connector without having to make modifications to the connector or the component module. That is, the ESD element 240 can be coupled adjacent to an opening of the socket of the connector in a manner such that a component module can make contact with the element before it makes contact with the socket of the connector. The above ESD techniques were subjected to test experiments. For example, in one experiment, the ESD techniques were able to withstand a charge of about 16 kv charge without damage to the memory components.

In one embodiment, the above connector 120 and component module 122 can be applied to memory electronics. For example, the above techniques can be applied to a small outline dual in-line memory module (SO-DIMM) which is a type of computer memory built using integrated circuits. In another example, the above techniques may be applicable to a dual in-line memory module (DIMM) which comprises a series of dynamic random access memory integrated circuits. In yet another example, these techniques can be equally applied to a single in-line memory module (SIMM). These modules can be mounted on a printed circuit board and designed for use in personal computers, workstations and servers or other electronic devices.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An electrical connector having electrostatic discharge protection comprising:
   a body that defines a socket having electrical contacts configured to make electrical contact with electrical contacts along a bottom surface of a component module when the component module is inserted in the socket; and
   an electrostatic discharge dissipative element configured to make electrical contact with the electrical contacts on the bottom surface of the component module before the electrical contacts on the bottom surface of the component module make electrical contact with the electrical contacts of the socket.

2. The electrical connector of claim 1, further comprising lateral arms that extend outward from the body, the electrostatic discharge dissipative element being connected to at least one of the arms.

3. The electrical connector of claim 2, wherein the component module is positioned between the lateral arms when the module is properly seated within the connector.

4. The electrical connector of claim 2, wherein the electrostatic discharge dissipative element is connected to a ground contact located on at least one of the lateral arms.

5. The electrical connector of claim 2, wherein the electrostatic discharge dissipative element comprises a generally contiguous body that is mounted between a first lateral arm and a second lateral arm of the lateral arms.

6. The electrical connector of claim 1, wherein the connector is connected to a memory controller and is configured to receive a memory card.

7. The connector of claim 1, wherein the electrostatic discharge dissipative element comprises foam having electrostatic discharge dissipative material.

8. The electrical connector of claim 1, wherein the electrostatic discharge dissipative element comprises a top surface and is disposed on the body to make contact with the bottom surface of the component module.

9. An electronic device having electrostatic discharge protection comprising:
   a circuit board having a top surface; and
   an electrical connector mounted to the top surface of the circuit board, the electrical connector comprising a body that defines a socket having electrical contacts configured to make electrical contact with electrical contacts along a bottom surface of the component module when the component module is inserted in the socket, and an electrostatic discharge dissipative element configured to make contact with the electrical contacts along the bottom surface of the component module before the electrical contacts along the bottom surface of the component module make electrical contact with the electrical contacts of the socket.

10. The electronic device of claim 9, further comprising lateral arms that extend outward from the body, the electrostatic discharge dissipative element being connected to at least one of the arms.

11. The electronic device of claim 10, wherein the component module is positioned between the lateral arms when the module is properly seated within the connector.

12. The electronic device of claim 10, wherein the electrostatic discharge dissipative element is connected to a ground contact located on at least one of the lateral arms.

13. The electronic device of claim 10, wherein the electrostatic discharge dissipative element comprises a generally contiguous body that is mounted between at least a first lateral arm and a second lateral arm of the lateral arms.

14. The electronic device of claim 9, wherein the connector is connected to a memory controller and is configured to receive a memory card.

15. The electronic device of claim 9, wherein the electrostatic discharge dissipative element comprises a foam having electrostatic discharge dissipative material.

16. The electronic device of claim 9, wherein the electrostatic discharge dissipative element comprises a top surface and is disposed on the body to make contact with the bottom surface of the component module.

17. A method of manufacturing an electrical connector having electrostatic discharge protection comprising:
   providing a body that defines a socket having electrical contacts configured to make electrical contact with electrical contacts along a bottom surface of a component module when the component module is inserted in the socket; and
   mounting an electrostatic discharge dissipative element to the body in a manner such that when the component module is inserted in the socket, the electrical contacts along the bottom surface of the component module make contact with the electrostatic discharge dissipative before the electrical contacts along the bottom surface of the component module make electrical contact with the electrical contacts of the socket.

18. The method of claim 17, wherein mounting further comprises connecting the electrostatic discharge dissipative element to at least one lateral arm that extends outward from the body.

19. The method of claim 17, wherein mounting further comprises connecting the electrostatic discharge dissipative element to a ground contact on at least one lateral arm that extends outward from the body.

20. The method of claim 17, further comprising mounting the electrical connector to a top surface of a printed circuit board.

* * * * *